(12) United States Patent
Ledentsov

(10) Patent No.: US 6,653,166 B2
(45) Date of Patent: Nov. 25, 2003

(54) SEMICONDUCTOR DEVICE AND METHOD OF MAKING SAME

(75) Inventor: Nikolai Ledentsov, Berlin (DE)

(73) Assignee: NSC-Nanosemiconductor GmbH, Dortmund (DE)

( * ) Notice: Subject to any disclaimer, the term of this patent is extended or adjusted under 35 U.S.C. 154(b) by 44 days.

(21) Appl. No.: 09/851,730

(22) Filed: May 9, 2001

(65) Prior Publication Data

US 2002/0167022 A1 Nov. 14, 2002

(51) Int. Cl.$^7$ .............................. H01L 21/00
(52) U.S. Cl. .................... 438/77; 438/22; 438/42; 438/77; 438/902; 438/962; 257/12; 257/14; 257/18; 257/19; 257/21; 257/85; 257/94; 257/190
(58) Field of Search ................ 438/46, 47, 77, 438/312, 602, 604, 606, 22, 702, 706, 715, 603, 412, 902, 962, 199; 257/12, 14, 21, 85, 94, 190, 19, 18, 33.008

(56) References Cited

U.S. PATENT DOCUMENTS

| | | | |
|---|---|---|---|
| 4,806,996 A | 2/1989 | Luryi | 357/16 |
| 5,019,874 A | 5/1991 | Inoue et al. | 357/16 |
| 5,075,744 A | 12/1991 | Tsui | 357/22 |
| 5,091,767 A | 2/1992 | Bean et al. | 357/60 |
| 5,156,995 A | 10/1992 | Fitzgerald, Jr. et al. | 437/90 |
| 5,208,182 A | 5/1993 | Narayan et al. | 437/110 |
| 5,482,890 A | * 1/1996 | Liu et al. | 438/494 |
| 5,719,894 A | 2/1998 | Jewell et al. | 372/45 |
| 5,859,864 A | 1/1999 | Jewell | 372/45 |
| 5,888,885 A | * 3/1999 | Xie | 438/493 |
| 5,927,995 A | 7/1999 | Chen et al. | 438/517 |
| 5,960,018 A | 9/1999 | Jewell et al. | 372/45 |

OTHER PUBLICATIONS

Chen, Y. et al, 1995, "Nucleation of misfit dislocations in $In_{0.2}Ga_{0.8}$ As epilayers grown on GaAs substrates", Appl. Phys. Lett 66 (4) 499–501.

Huffaker, D.L. et al, 1998, "1.3 $\mu$m room–temperature GaAs–based quantum–dot laser", Appl Phys. Lett. 73 918), pp 2563–3566.

(List continued on next page.)

Primary Examiner—George Fourson
Assistant Examiner—Julio J. Maldonado
(74) Attorney, Agent, or Firm—Brown & Michaels, PC

(57) ABSTRACT

The method produces coherent dislocation-free regions from initially dislocated and/or defect-rich lattice mismatched layer grown on top of the substrate having a different lattice constant, which does not contain any processing steps before of after the lattice-mismatched layer growth. The process preferably uses in situ formation of a cap layer on top of a dislocated layer. The cap layer preferably has a lattice parameter close to that in the underlying substrate, and different from that in the lattice mismatched layer in no strain state. Under these conditions, the cap layer undergoes elastic repulsion from the regions in the vicinity of the dislocations, where the lattice parameter is the most different from that in the substrate. The cap layer is absent in these regions. When the cap layer has a lower thermal evaporation rate than the underlying lattice-mismatched layer, the regions of this lattice-mismatched layer containing dislocations are selectively evaporated at high enough temperatures, and only the coherent defect-free regions of the initially defect-rich lattice-mismatched layer remain on the substrate. In one embodiment of the invention, the defect-free regions are formed on the substrate with a size preferably tuned in the range of 30–1000 nm, depending on the annealing conditions, thickness of the cap layer, and the lattice mismatch. A device created by this method is also disclosed.

10 Claims, 7 Drawing Sheets

OTHER PUBLICATIONS

Blum, O. et al, 2000, "Characteristics of GaAsSb Single-Quantum-Well-Lasers Emitting Near 1.3 µm", IEEE Photonics Technology Letters, vol. 12, No. 7, pp 771–773.

Nakahara, K. et al, 1998, "1.3 µm Continuous-Wave Lasing Operation in GaIaNAs Quantum-Well Lasers", IEEE Photonics Technology Letters, vol. 10, No. 4, pp 487–488.

Schlenker, D. et al, 1999, "1.17 µm Highly Strained GaIaAs– GaAs Quantum-Well Laser", IEEE Photonics Technology Letters, vol. 11, No. 8, pp. 946–948.

Lee, B. et al, 1996, "Optical properties of InGaAs linear graded buffer layers on GaAs grown by metalorganic chemical vapor deposition", Appl. Phys. Lett. 68 (21), pp 2973–2975.

Roan, E.J. et al, 1991, "Long-wavelenght (1.3 µm) luminescence in InGaAs strained quantum-well structures grown on GaAs", Appl. Phys. Lett. 59 (21), pp 2688 2690.

Herman, M.A. et al, 1991, "Heterointerfaces in quantum wells and epitaxial growth processes: Evaluation by luminescence techniques" J. Appl. Phys. 70 (2), pp. 52.

Elman, B. et al, 1989, "In situ measurements of critical layer thickness and optical studies of InGaAs quantum wells grown on GaAs substrates", Appl. Phys. Letter. 55 (16), pp 1659–1661.

Alferov. Zh. et al, 1971 , "Investigation of the Influence of the AlAs—GaAs Heterostructure Parameters on the Laser Threshold Current and The Realization of Continuous Emission at Room Temperature", Soviet Physis—Semiconductors, vol. 4, No. 9, pp 1573–1575.

Alferov, Zh. et al, 1970, "AlAs—GaAs Heterojunction Injection Lasers With A Low Room-Temperature Threshold", Soviet Physis—Semiconductors, vol. 3, No. 9, pp 1107–1110.

Gourley, P.L. et al, 1988, "Controversy of Critical Layer Thickness for InGaAs/GaAs strained-layer Epitaxy", Appl. Phys. Lett. 52 (5), pp 377–379.

Tsang, W.T., 1981, "Extension of lasing wavelenghts beyond 0.87 µm in GaAs/$Al_xGa_{1-x}As$ double-heterostructure lasers by In incorporation in the GaAs active layers during molecular beam epitaxy", Appl. Phys. Lett. 38 (9), pp 661–663.

Hayashi, I. et al, 1970, "Junction Lasers which Operate Continuously At Room Temperature", Applied Physics Letters, vol. 17, No. 3, pp 109–111.

Goldstein, L. et al, 1985, "Growth by molecular beam epitaxy and characterization of InAs/GaAs strained-layer superlattices", Appl. Phys. Lett. 47 (10), pp 1099–1101.

Beanland, R. et al, 1997, "Relaxation of strained epitaxial layers by dislocation rotation, reaction and generation during annealing", Inst. Phys. Conf. Ser. No. 157, pp 145–148.

Glas, F. et al, 1987, "TEM study of the molecular beam epitaxy island growth of InAs on GaAs", Inst. Phys. Conf. Ser. No. 87: Section 2, pp 71–76.

Scott A. McHugo and William D. Sawyer Impurity decoration of defects in float zone and polycrystalline silicon via chemomechanical polishing Applied Physics Letters (1993) vol. 62, Issue 20, pp. 2519–2521.

B. Shen, X. Y. Zhang, K. Yang, P. Chen, R. Zhang, Y. Shi, Y. D. Zheng, T. Sekiguchi and K. Sumino Gettering of Fe impurities by bulk stacking faults in Czochralski–grown silicon Applied Physics Letters (1997) vol. 70, Issue 14, pp. 1876–1878.

M. Herrera Zaldivar, P. Fernandez, and J. Pique Study of defects in GaN films by cross-sectional cathodoluminescence Journal of Applied Physics (1998)—vol. 83, Issue 5, pp. 2796–2799.

Ledentsov, N. N. "Long-Wavelenght Quantum-Dot Lasers on GaAs substrates: From Media to Device Concepts" IEEE Journal of Selected Topics in Quantum Electronics, vol. 8, No. 5, Sep./Oct. 2002 pp. 1015–1024.

* cited by examiner (a)

(b)

(c)

(d)

200 nm (a)

(b)

SEMICONDUCTOR DEVICE AND METHOD OF MAKING SAME

BACKGROUND OF THE INVENTION

1. Field of the Invention

The invention pertains to the field of semiconductor devices. More particularly, the invention pertains to semiconductor light sources, photodetectors and resonant tunneling devices, which have a large lattice mismatch between a substrate and an active region.

2. Description of Related Art

The problem of lattice matching of constituent materials in semiconductor heterostructures is critically important. The first double heterostructure laser, realized using lattice-mismatched GaAs-GaAsP materials, did not perform well enough to be used in practical applications. Progress in this area began only after lattice-matched heterostructures were developed, lasers with low room temperature threshold current density were obtained, and continuous wave operation at room temperature was achieved.

Only relatively small lattice mismatch can be tolerated in high-performance devices, for example, in a GaAs-AlGaAs heterostructure. In the case of a small lattice mismatch, the growth of the layer occurs pseudomorphically, or irregularly, and the layer accumulates significant strain energy. For example, W. T. Tsang, in Applied Physics Letters 38(9), May 1, 1981, pp. 661–663, described a GaAs/AlGaAs heterostructure laser having an InGaAs active layer. The indium was incorporated into the active layer in order to increase the output wavelength up to 0.94 $\mu$m. After a certain thickness, or composition, however, the strain energy becomes very high, and dislocations start to form, which ruins device performance. The critical thickness for dislocation formation rapidly decreases with increases in the lattice mismatch. For InGaAs-GaAs layers, this results in a fast degradation of luminescence properties at InGaAs layer thickness corresponding to the practically important wavelength range of 1.3–1.6 $\mu$m.

Dislocations take a negligibly small surface area of the plastically relaxed layer. The regions between the dislocations may remain structurally and optically perfect and their sizes may approach micrometer-scale sizes even with high lattice mismatch and thick plastically-relaxed layers.

The exact thickness for dislocation formation, the density of dislocations formed after plastical relaxation, and the degree of deterioration of optical properties may depend on particular surface morphology and deposition conditions. Under certain growth sequences, bright luminescence in the range of up to 1.35 $\mu$m may be realized at room temperature using highly strained InGaAs quantum wells and up to 1.7 $\mu$m using thicker graded-composition InGaA layers on GaAs substrates. Injection lasing has been demonstrated at 1.17 $\mu$m using an InGaAs quantum well grown on top of the GaAs-inserted strained ultrathin InGaAs buffer layer. Prior attempts to move the lasing wavelength further using InGaAs quantum wells have failed. So, in order to utilize longer wavelengths using GaAs substrates, it became necessary to use either different materials systems, such as InGaAsN-GaAs or GaAsSb-GaAs, or to apply different growth approaches, such as using an effect of elastic strain relaxation in Stranski-Krastanow growth mode. This process, accompanied by overgrowth of the islands formed may result in formation of strained coherent nanodomains, also called quantum dots, emitting up and beyond 1.3 $\mu$m.

However, these approaches do not yield a device with practically-acceptable parameters, cost-effective and reliable technology, and also result in formation of dislocations and other defects (e.g. dislocation loops, defect dipoles, dislocated clusters).

Numerous patents have tried to overcome the problem of lattice mismatch in fabricating semiconductor heterostructure devices. U.S. Pat. Nos. 5,960,018, 5,075,744, and 5,719,894, for example, used strain-compensation regions inside or near the active region of the device. Other patents, such as U.S. Pat. Nos. 5,019,874, 5,208,182, 5,927,995 and 5,091,767, each used dislocation filtering techniques to prevent dislocation propagation in the active layer or reducing their density. U.S. Pat. Nos. 5,156,995, 5,859,864, and 4,806,996 used complicated growth methods on profiled substrates. All these approaches, however, led only to a limited success, or were not cost-effective.

Therefore, there is a need in the art for a method which eliminates local regions of the relaxed semiconductor structure in the vicinity of dislocations in situ, without any of the additional processing steps which are required in the prior art.

SUMMARY OF THE INVENTION

A method of in-situ fabrication of dislocation-free structures from plastically relaxed layers grown on a semiconductor surface suitable for epitaxial growth is disclosed. This method solves the problem of lattice-mismatched growth.

The method produces coherent dislocation-free regions from initially dislocated and/or defect-rich layers lattice mismatched with respect to the underlying substrate, which does not contain any processing steps before or after formation of the defect-free-regions. The process preferably uses in situ formation of a cap layer on top of a dislocated layer. The cap layer preferably has a lattice parameter close to that in the underlying substrate, and different from that in the lattice mismatched epilayer in the no-strain state. Under these conditions, the cap layer undergoes elastic repulsion from the regions in the vicinity of the dislocations, where the lattice parameter is the most different from that in the substrate. The cap layer is absent in these regions. When the cap layer has a lower thermal evaporation rate than the underlying dislocation layer, the regions of this dislocation layer in the vicinity of dislocations are selectively evaporated at sufficiently high temperatures, and only the coherent defect-free regions of the initially-dislocated epilayer remain on the surface. In one embodiment of the invention, the size of the defect-free regions are preferably tuned in the range of 30–1000 $\mu$m, depending on the annealing conditions, thickness of the cap layer, and the lattice mismatch. A device created by this method is also disclosed.

DETAILED DESCRIPTION OF THE INVENTION

A method for fabricating a semiconductor device based on dislocation-free epitaxial materials having significantly large differences in lattice constants solves the problem of lattice-mismatched growth. Devices fabricated using this method are also disclosed.

Figure 1:
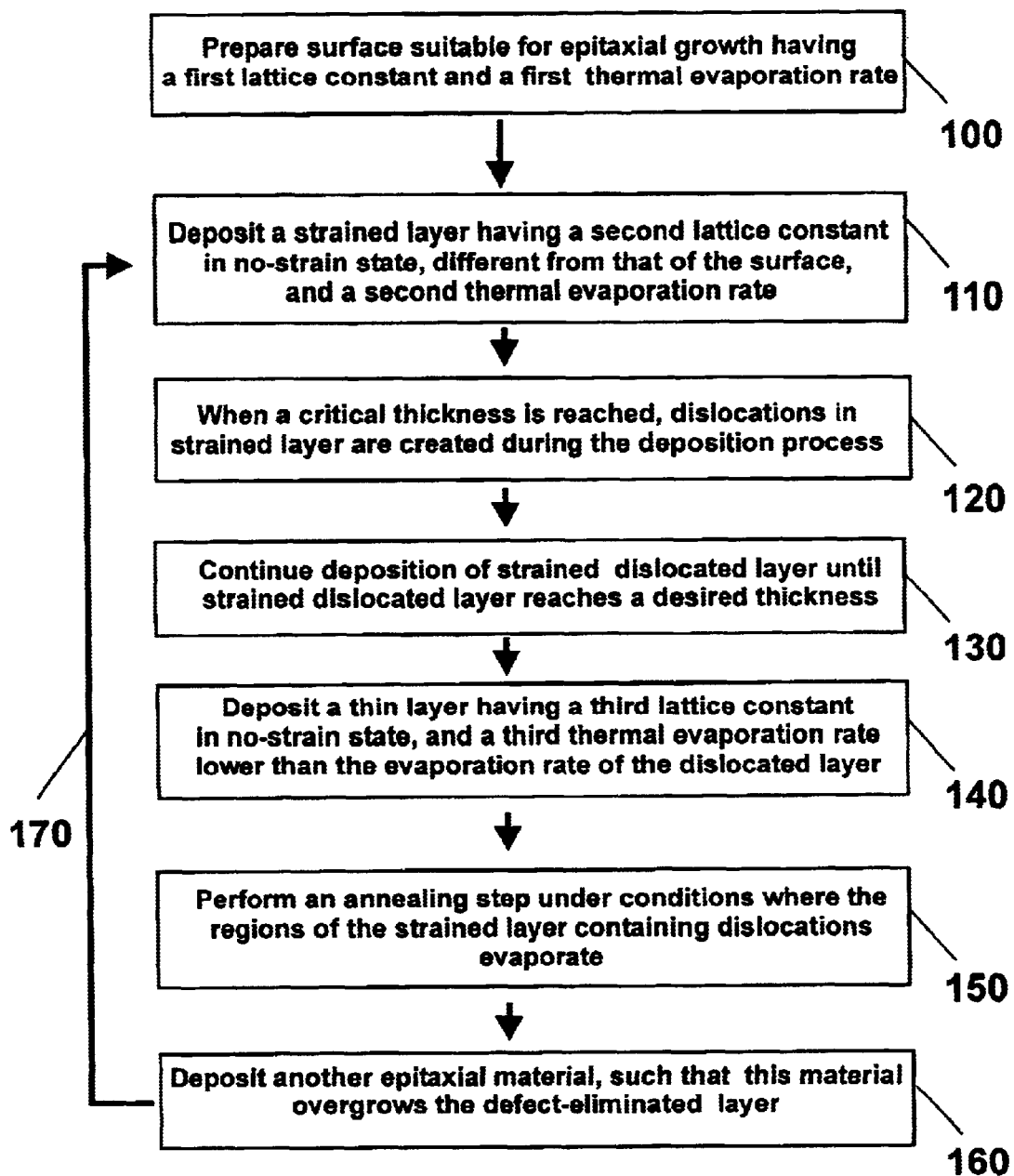
FIG. 1 shows a flowchart of the method in a preferred embodiment of the invention.
Figure 2:
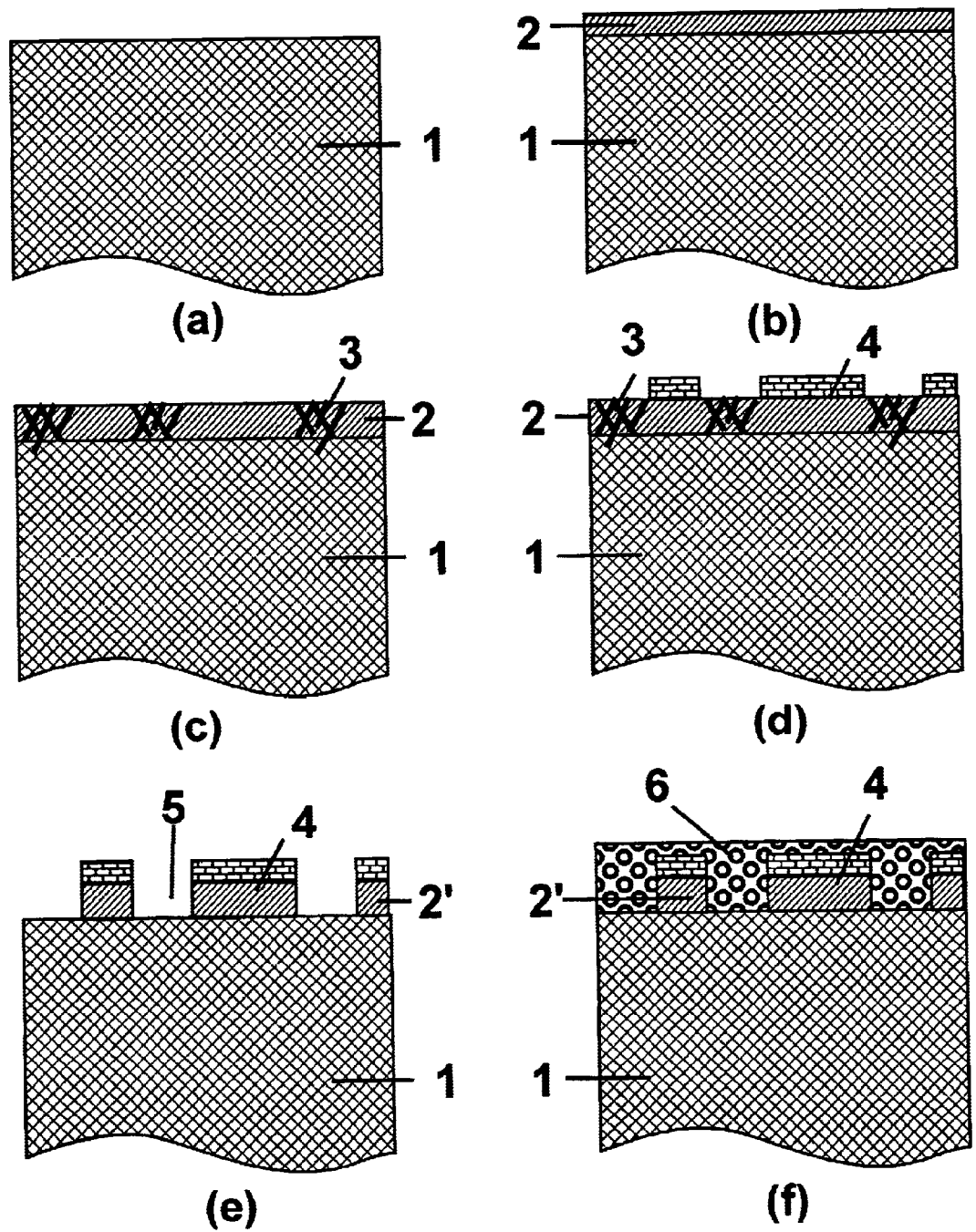
FIG. 2(a) shows a substrate, or an epitaxial layer grown on top of some substrate, with a surface suitable for further epitaxial growth in a preferred embodiment of the invention.
FIG. 2(b) shows FIG. 2(a) after beginning deposition of a lattice-mismatched layer in a preferred embodiment of the invention.
FIG. 2(c) shows FIG. 2(b) after the strain has caused appearance of dislocations and local defects, at some critical thickness, in the lattice-mismatched layer in a preferred embodiment of the invention.
FIG. 2(d) shows FIG. 2(c) after a cap layer has been deposited on top of the lattice-mismatched layer of the device in a preferred embodiment of the invention.
FIG. 2(e) shows FIG. 2(d) after a high temperature-annealing step has been performed in a preferred embodiment of the invention.
FIG. 2(f) shows FIG. 2(e) after further overgrowth of the defect eliminated layer regions by an additional layer of the material having a similar lattice constant with the substrate in a preferred embodiment of the invention.

Referring to FIGS. 1 and 2 (a)–(f), the approach is based on essentially several effects. In step (100), a crystal surface based on material (1) suitable for epitaxial growth is prepared, as it is shown in FIG. 2(a). The crystal surface of material (1) is preferably composed of GaAs, or other III–V, II–VI compound semiconductors or their alloys, or elemental group IV semiconductors and their alloys, or oxides (e.g. $Al_2O_3$). The crystal surface has a first lattice constant in no-strain case. No strain state can be realized in bulk material or in freely suspended film and the lattice parameters of all the relevant materials in no-strain state are available in hand-books. In a preferred embodiment, an epilayer is deposited on the surface during this step.

In step (110), a lattice mismatched layer (2), which has a second lattice constant in no-strain case, is grown on top of the surface material (1), resulting in the intermediate device shown in FIG. 2(b). The lattice-mismatched layer (2) is preferably composed of group III–V, or II–VI compound semiconductor or SiGe material, epitaxially grown on generally the whole area of the initial surface (1), wherein the lattice constant of the lattice-mismatched layer (2) in no-strain state differs from a lattice constant of the initial surface (1). The growth initially proceeds pseudomorphically, and the lateral lattice parameter of the grown film is equal to the lattice constant of the surface. At this stage, significant strain energy accumulates in the lattice-mismatched layer (2) because the second lattice constant differs from the lattice constant of the substrate material (1). At some critical thickness, the strain energy results in partial plastic relaxation of the lattice-mismatched layer (2) via formation of dislocations (3), such as dislocation networks, local defects, and dislocated three-dimensional clusters in step (120). The critical thickness can be estimated similar to reported by J. W. Mattheus and A. E. Blackslee, J. Cryst. Growth 27, 118 (1974). These dislocations (3) are shown in FIG. 2(c). Deposition of the lattice-mismatched dislocated layer (2) continues until it reaches a desired thickness in step (130). The dislocated layer (2) may have a corrugated surface, and/or represent a compositionally modulated internal structure.

During steps (110) through (130), the lattice-mismatched layer (2) is preferably formed by supplying source materials of group III and V elements, group II and VI elements, or group VI elements, constituting group III–V compound semiconductor, or II–VI semiconductor, or group IV semiconductor materials, to a reaction chamber. Then, a thin layer of semiconductor material is initially formed and each element is supplied during a defined time period. The total thickness of the dislocated layer (2) exceeds the critical thickness necessary for dislocation (3) formation. Some examples of growth techniques which could be employed are molecular beam epitaxy, metal-organic chemical vapor deposition, or related growth techniques. Steps (100) through (130) are optionally repeated, preferably from two times to twenty four times.

After the desired average thickness of the dislocated layer (2) is achieved, a cap layer (4) with a third lattice constant in no-strain case is deposited in step (140). The third lattice constant is preferably close to the lattice constant of the initial surface, or, at least, it should be closer to the initial surface (1) lattice constant, than to the dislocated layer (2) lattice constant in no-strain case, or the lattice mismatch of the cap layer in no strain-state with the initial surface has another sign as the lattice mismatch of the dislocated layer in no-strain case and the initial surface. The temperature during the growth of the cap layer (4) allows migration of atoms of the material of the cap layer (4) towards the energetically-favorable cites. As a result of these conditions, the areas of the dislocated layer (2) near the dislocations (3) are initially not covered by the cap layer (4). The lattice constant in these regions is close to that of the dislocated layer (3) in no-strain state, and these regions are less energetically favorable for nucleation of the cap layer (4) having no, or small lattice mismatch with the semiconductor surface in no-strain state, or the lattice mismatch of the cap layer (4) with the semiconductor surface in no-strain state is of the opposite sign. The total thickness of the layer is kept in such a way that the driven of the cap material leaves the areas of the dislocated layer (2) near the dislocations (3) open. The thermal evaporation rate of the cap layer (4) is preferably lower than that of the dislocated layer (2). The thermal evaporation rate of the initial surface (1) is preferably lower than that of the cap layer (4).

The substrate (1) temperature during epitaxial growth is generally sufficient for adatoms of semiconductor materials, which are present on the surface in some concentrations at elevated temperatures, to diffuse to energetically favorable sites, resulting in redistribution of the cap layer (4) during or after epitaxial deposition. As the third lattice constant is preferably close to that of the substrate (1), the cap layer (4) deposition preferably concentrates away from the regions of the dislocated layer (2) in the vicinity of dislocations (3) and/or local defects, as the lattice constant in these regions is close to the second lattice constant, and the cap layer (4) deposit is more strained when formed in these regions. Thus, the regions of the dislocated layer (2) in the vicinity of dislocations (3) are preferably not covered. A preferable distribution of the cap layer (4) is shown in FIG. 2(d).

The cap layer (4) is preferably composed of group III–V, or II–IV compound semiconductor, or SiGe. However, the cap layer (4) preferably has a different composition ratio of constituent elements from the dislocated layer (2). The cap layer (4) preferably has a similar lattice constant as the initial surface material (1) in the no-strain state. Alternatively, the lattice constants of the cap layer (4) in no-strain state differs from a lattice constant of the initial surface (1), but the difference between the lattice constant of the cap layer (4) in no-strain state and the lattice constant of the initial surface (1) is smaller than the difference between the lattice constant of the dislocated layer (2) in no-strain state and the lattice constant of the initial surface. In a third embodiment, the lattice mismatch of the cap layer (4) with the initial surface (1) in no-strain state is preferably of the opposite sign as the lattice mismatch of the dislocated layer (2) and the initial surface (2) in no-strain state.

After the cap layer (4) is deposited, the substrate temperature is increased up to a temperature where the evaporation of the dislocated layer (2) becomes significant in step (150). The regions containing dislocations and local defects (3), which are not covered by the cap layer (4), are selectively etched-off. The regions of the dislocated layer (2) capped by the cap layer (4) remain on the surface. The resulting structure, shown in FIG. 2(e), represents an array of regions of the defect eliminated layer (2') covered by the cap layer (4) and separated by trenches (5), having a width defined by the etching time and temperature.

The etching time is preferably chosen so that thermal etching results in complete evaporation of defects. In one embodiment reduction of the lateral size of the regions of the dislocated layer (2) to approximately 20–100 nm occurs.

In this case the top regions of the lattice-mismatched defect-eliminated layer may relax elasticall via lateral extension into the trenches. The strain distribution becomes non-uniform along the height of the regions of the defect-eliminated layer, and the regions near the initial surface accumulate the highest strain energy. This etching scenario results in preferential etching of the defect-eliminated layer (2') near the interface with the initial surface (2) due to the higher residual strain in this region, thus leading to a mushroom-type pedestals for further epitaxial growth. Alternatively, the etching temperature and time are chosen so that thermal etching of the regions of the defect-eliminated layer (2) results in evaporation of a significant part of this layer (2').

In a third embodiment, the annealing step is performed at temperatures sufficient for dislocation (3) multiplication. The domains in this embodiment are preferably 20–100 nm.

In an alternative embodiment, the dislocated layer (2) is deposited using a composition of source materials under certain conditions and growth sequences to realize a region where the plastic relaxation occurs via local formation defect dipoles, dislocated clusters, or other local defects, affecting in their vicinity the in-plane lattice parameter of the semiconductor material formed in this step. In this embodiment, steps (140) and steps (150) result in local holes in the defect eliminated layer (2').

In step (160), an additional layer (6) made of the material as the initial surface is deposited on the device, so that it overgrows the cap layer (4). The resulting structure is shown in FIG. 2(f). Alternatively, the additional layer (6) is not identical to the initial surface material (1), but has a lattice constant close to the lattice constant of the initial surface material (1), and is grown or the defect-free-regions are used as templates for further epitaxial growth of semiconductor material having an arbitrary lattice parameter. In both situations, the growth is accomplished according to the desired geometry of a practical device. The additional layer (6) is preferably composed of group III–V or II–VI compound semiconductor or SiGe, or multilayer structure. Steps (110) through (160) are preferably repeated in step (170) two to forty times, depending on the device being fabricated. In one embodiment, the layers are doped to provide free electron or hole concentration in the defect eliminated layer (2') preferably in the $10^{17}$–$10^{19}$ cm$^{-3}$ range.

Steps 140–160 are optionally repeated preferably two to forty times to provide optimal elimination of defects.

Alternatively, an additional layer (6) is deposited by supplying the source materials in such conditions that realize a composition of a lattice constant different to that of the semiconductor surface in no-strain state of a thickness permitting elastic relaxation of the resulting strain at the boundaries of the domain. In this embodiment, subsequent growth of the additional layer (6) occurs faster at the edge facets of the deposit, which results in lateral merger of the additional layer (6) before all the trenches and the holes are filled with material of the additional layer (6).

In an example of a preferred embodiment of the invention, the initial surface (1) is preferably composed of $Al_YGa_{1-Y}As$ and deposited on a substrate preferably composed of GaAs. The dislocated layer (2) and the cap layer (3) are preferably composed of $In_XGa_{1-X}$ and $Al_ZGa_{1-Z}As$, respectively. Initially growth of the $Al_YGa_{1-Y}As$ layer (1) on top of the GaAs substrate takes place to produce an $Al_YGa_{1-Y}As$ surface (1) suitable for further epitaxial growth in step (100).

During step (110), the $In_XGa_{1-X}As$ layer (2) is deposited on the $Al_YGa_{1-Y}As$ layer (1). The growth initially proceeds pseudomorphically and the elastic strain accumulates in the layer. At some critical thickness, the strain accumulated in the $In_XGa_{1-X}As$ layer (3) relaxes plastically via dislocation (3) formation in step (120). Alternatively, the strain relaxes both plastically and elastically with formation of both dislocations and InGaAs surface corrugations or dislocated InGaAs clusters.

Further growth of the plastically relaxed $In_XGa_{1-X}As$ layer (2) is continued in step (130). After the required thickness of the $In_XGa_{1-X}As$ layer (2) is deposited, an $Al_ZGa_{1-Z}As$ layer (4) is deposited on top of the surface in step (140). As the lattice constant of the $Al_ZGa_{1-Z}As$ layer (4) differs from that of the plastically relaxed $In_xGa_{1-x}As$ layer (2), the $Al_ZGa_{1-Z}As$ layer (4) predominantly nucleates in the regions away from dislocations (3).

After the desired thickness of the $Al_ZGa_{1-Z}As$ layer (4) is achieved, a high temperature annealing step is performed in step (150). The regions of the $In_xGa_{1-x}As$ layer (2) covered by the $Al_ZGa_{1-Z}As$ layer (4) remain, and the uncovered $In_xGa_{1-x}As$ regions (3) evaporate from the surface. Dislocations (3) are no longer present in the structure.

This system of coherent domains may be used for further epitaxial growth. In this example, a thick $Al_YGa_{1-Y}As$ layer (6) may be grown, covering the coherent InGaAs, and resulting in a coherent epitaxial structure. Steps (110)–(160) are optionally repeated in step (170).

The resulting size and the shape of the domains depends on the particular annealing conditions chosen, and the annealing procedure is optionally repeated several times using different cap semiconductor materials and annealing times to eliminate different types of dislocations and local defects, including but not limited to dislocation dipoles and spontaneously formed dislocated clusters.

The resulting structure can be viewed in plan-view and cross-section transmission electron microscopy and in high-resolution transmission electron microscopy, in scanning tunnelling microscopy and in atomic force microscopy from the surface side and in cross-section geometry.

As another example, a III–V compound initial surface (1) is preferably composed of $Al_xGa_{1-x}As$, where x=0–0.3. The dislocated layer (2) is $In_xGa_{1-x}As$, where x=0.3–0.45, and has a preferable total thickness of 10–20 nm. Alternatively, deposition of the dislocated layer (2) is preferably executed in three stages. First, a preferably 5 nm-thick $In_xGa_{1-x}As$ layer, where x=0.1–0.15, is grown. Then, a preferably 10 nm-thick $In_xGa_{1-x}As$ layer, where x=0.3–0.45, is grown in the second stage, and a preferably 5 nm-thick $In_xGa_{1-x}As$ layer, where x=0.1–0.15, is grown in the third stage. This three step process results in the photo and electroluminescence emission at wavelength of 1.3–1.4 $\mu$m at room temperature. If the $In_xGa_{1-x}As$ layers are doped with nitrogen to preferably 1–5%, a photo and electroluminescence emission at wavelength of 1.3–1.6 $\mu$m at room temperature results.

In this example, the cap layer (4) is preferably composed of $Al_xGa_{1-x}As$, where x=0.3–1. The cap layer (4) has a preferable thickness of 4 nm. The dislocated layer (2) is $In_xGa_{1-x}As$, where x=0.3–0.45, and has a preferable total thickness of 10–20 nm. Deposition of the dislocated layer (2) and the cap layer (3) in steps (110) through (130) and (140), respectively, are performed at a growth temperature of preferably 450–600° C. The annealing and evaporation step (150) is performed at preferably 650–750° C. for approximately one minute. Arsenic-containing species are either continuously or interruptedly supplied. Deposition of the additional layer in step (160) is executed at preferably 600–750° C. The layer formed during this step is $Al_xGa_{1-x}As$, where x=0–0.3. This deposition results in the photo and electroluminescence emission at wavelengths of 1.2–1.3 $\mu$m at room temperature. The device formed by this method is preferably placed inside a p-n junction sandwiched between two multilayer structures, representing distributed Bragg reflectors, and serves as a vertical-cavity surface-emitting laser emitting preferably in the 1.3 to 1.55 $\mu$m range. In this example, steps (110) through (160) are preferably performed on top of a multilayer distributed Bragg reflectors.

In the other case the device formed by this method is preferably placed inside a p-n junction sandwiched between two cladding layers having a lower refractive index, and serves as an edge-emitting laser emitting preferably in the 1.3 to 1.55 $\mu$m range.

In this example, steps (110) through (160) are preferably performed on top of a multilayer structure. The multilayer structure includes a GaAs substrate doped to a free-electron concentration of preferably $10^{18}$ cm$^{-3}$. An $Al_xGa_{1-x}As$ layer, where x=0.4–0.8, has a thickness preferably 1–2 $\mu$m and is doped to a free-electron concentration of preferably $5 \times 10^{17}$ cm$^{-3}$. A second $Al_xGa_{1-x}As$ layer, where x=0–0.3, is preferably 0.1–0.4 $\mu$m thick and is doped to a free-electron or free hole concentration preferably lower than $5 \times 10^{16}$ cm$^{-3}$. The semiconductor region formed by steps (110) through (160) are covered by an $Al_xGa_{1-x}As$ layer with a preferable thickness of 0.1–0.4 $\mu$m and a composition preferably x=0–0.3, doped to free-electron or free hole concentration preferably lower than $5 \times 10^{16}$ cm$^{-3}$, an $Al_xGa_{1-x}As$ layer having a thickness preferably 1–2 $\mu$m and a composition preferably x=0.4–0.8, doped to free-hole concentration preferably $5 \times 10^{17}$ cm$^{-3}$, and a GaAs cap layer doped to free hole concentration preferably higher than $10^{18}$ cm$^3$. In this embodiment, the metal contact layers are deposited and annealed to form metal contacts to the n-GaAs substrate and the top p-contact layer, resulting in an injection laser device operating at room temperature in the wavelength range at and beyond 1.3 $\mu$m.

Another example of the method is illustrated according to the growth sequence proposed. Referring also to FIG. 3(a) and (b), dislocation and composition maps prepared according to cross-section (a) and plan-view (b) transmission electron microscopy (TEM) images of the device with an initially 20 nm-thick $In_{0.3}Ga_{0.7}As$ layer (2) deposited on an $Al_{0.2}Ga_{0.8}As$ surface (1), covered by a 2 nm-thick AlAs layer (4) are shown. The device is subjected to high temperature annealing at 750° C. inside the metal-organic chemical vapor deposition (MOCVD) reactor in situ in a hydrogen atmosphere, without arsine (AsH$_3$) flow and covered by an $Al_{0.2}Ga_{0.8}As$ layer (6). The structure is grown on a GaAs (100)-oriented substrate. Similar maps are obtained for otherwise similar samples but fabricated using molecular beam epitaxy. The map after the growth of the dislocated $In_{0.3}Ga_{0.7}As$ layer is shown in FIG. 3(a). A dislocation network is observed propagating along {100}-like directions. Local dark defects due to local defects are also observed. The map of the structure with deposited cap AlAs layer is shown in FIG. 3b. It is seen on the map, that AlAs nucleates away from the dislocations and defect regions. Etching with an AlAs cap layer (4) results in locally etched-away InGaAs regions containing dislocations as shown in FIG. 3(c). The lateral size of the defect-free InGaAs regions is smaller than the average distance between dislocations in the not annealed sample in FIG. 3(a) due to the etching effect and multiplication of dislocation during annealing. Cross-section composition composition map of the sample subjected to annealing and AlGaAs overgrowth is given in FIG. 3(d). The defect-free InGaAs regions have a mushroom shape as the $In_{0.3}Ga_{0.7}As$ layer (2) is thermally etched with a higher rate in the regions close to the interface with the initial surface (1), because the strain energy in these regions is the highest. The dislocations (3) are gone and the etched-away sections of the $In_{0.3}Ga_{0.7}As$ layer (2) are filled with $Al_{0.2}Ga_{0.8}As$ (6). The symmetry of the regions formed is different from the symmetry of the initial dislocation network with the main axes along (001) and (010) directions, but is similar to reported by R. Beanland, M. A. Lourenco, K. P. Homewood, Microscopy of Semiconductor Materials. Eds.: A. G. Gullis, J. L. Hutchinson, Inst. Phys. Conf. Series 1997, V. 157, IoP, pp. 145–148 for the dislocated layer subjected to high temperature annealing, resulting in multiplication of dislocations (3). Thus, multiplication of dislocations (3) is tolerated in the present invention, as the AlGaAs cap layer (4) redistributes over the newly dislocated parts during the dislocation multiplication stage. On the other hand, this effect may be used intentionally to tune the size of the coherent domain to the desired lateral size.

Figure 3:
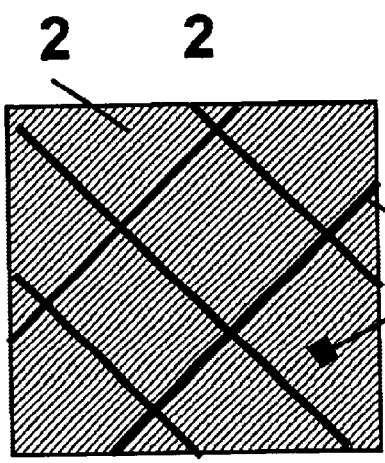
FIG. 3(a) shows a typical plan-view dislocation map of the dislocated lattice-mismatched layer of the device before the deposition of a cap layer in a preferred embodiment of the invention.
FIG. 3(b) shows a typical plan-view dislocation and composition map of the dislocated lattice-mismatched layer of the device after the deposition of a cap layer in a preferred embodiment of the invention.
FIG. 3(c) shows a typical plan-view dislocation and composition map in the defect-eliminated layer of the device overgrown with a thin-layer deposition by a material having a similar lattice constant to the substrate after the heat-treatment procedure in a preferred embodiment of the invention.
FIG. 3(d) shows a typical cross-section dislocation and composition map of the defect-eliminated layer of the device after the heat-treatment procedure after deposition of a cap layer (followed by overgrowth with a material having a similar lattice constant to the substrate) in a preferred embodiment of the invention.
FIG. 3(e) shows a typical cross-section dislocation and composition map of the defect-eliminated layer of the device after the heat-treatment procedure after deposition of a cap layer (followed by overgrowth with a material having a similar lattice constant to the substrate) in a preferred embodiment of the invention.
Figure 3:
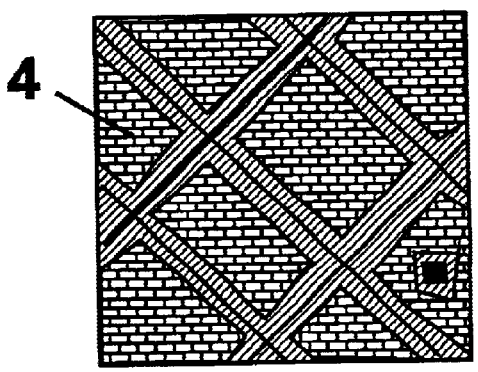
Figure 3:
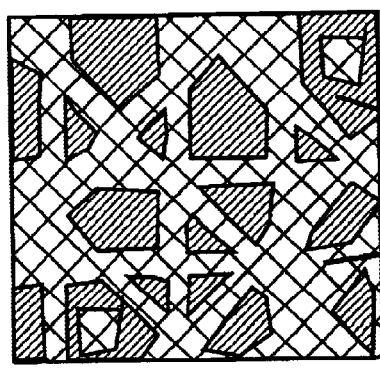
Figure 3:
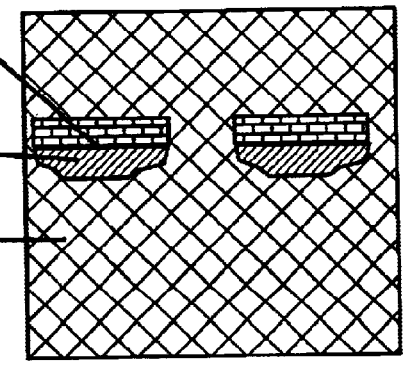
Figure 4:
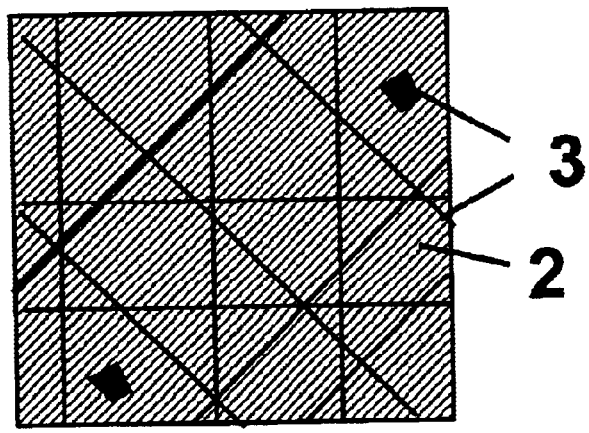
FIG. 4(a) shows a typical plan-view dislocation and composition map in the dislocated layer of the device after the deposition of a cap layer subjected to thick-layer overgrowth with a material having a similar lattice constant to the substrate and the heat-treatment procedure.
FIG. 4(b). shows a plan-view dislocation and composition map of the device similar to shown in FIG. 3c, but subjected to annealing without the cap layer.
Figure 4:
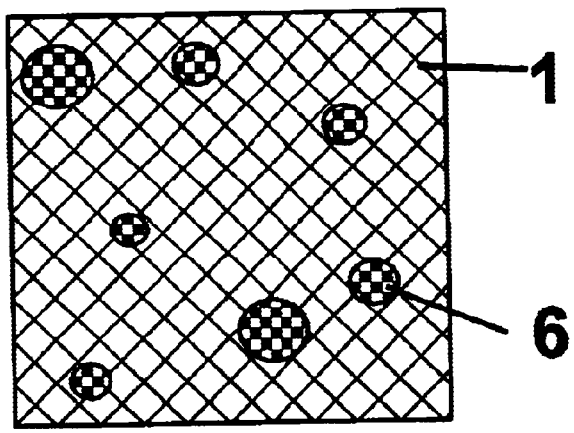

FIG. 4(a) shows a composition and dislocation maps according to plan-view transmission electron microscopy image of a device similar to the device shown in FIG. 3(c), but annealed after the thick additional AlGaAs layer (6) was deposited. In this case the density of dislocations and defects is increased as compared to just deposited dislocated InGaAs layers in FIG. 3a. This happens due to well-known dislocation multiplication process. Thus just annealing performed in the wrong sequence of the processing steps, opposite to the steps described in the current invention (100)–(170) results only in degradation of the device.

FIG. 4(b) shows a composition and dislocation maps according to plan-view transmission electron microscopy image of a device similar to the device shown in FIG. 3(c), but annealed without the AlAs cap layer (4) to demonstrate that the step of capping is decisive for the formation of defect-free coherent domains. The annealing was performed on a stage, schematically presented in FIG. 2(c). This structure is similar in all other growth sequences discussed for FIG. 3, but annealed without the AlGaAs cap layer (4). There is clearly degradation of the surface and local formation of Indium droplets (16). Thus, capping with a temperature stable cap layer (4), for example, an AlGaAs layer, is a key point in protecting the underlying coherent domains formed from initially dislocated layer during the evaporation procedure aimed at defect reduction.

In an alternative embodiment, further epitaxial growth is disclosed. After the coherent regions of the defect eliminated layer are formed on the surface, a next layer of semiconductor material, or multilayer structure, with an average lattice constant close to that of the underlying semiconductor surface, is grown according to the desired geometry of the practical device. In this case the coherent domains are inserted in a single-crystalline matrix having a similar lattice parameter as the surface. This approach is, for example, advantageous for producing long-wavelength lasers on GaAs substrates using coherently-strained InGaAs domains embedded in (Al)GaAs matrix, acting as an active medium of the device.

Figure 5:
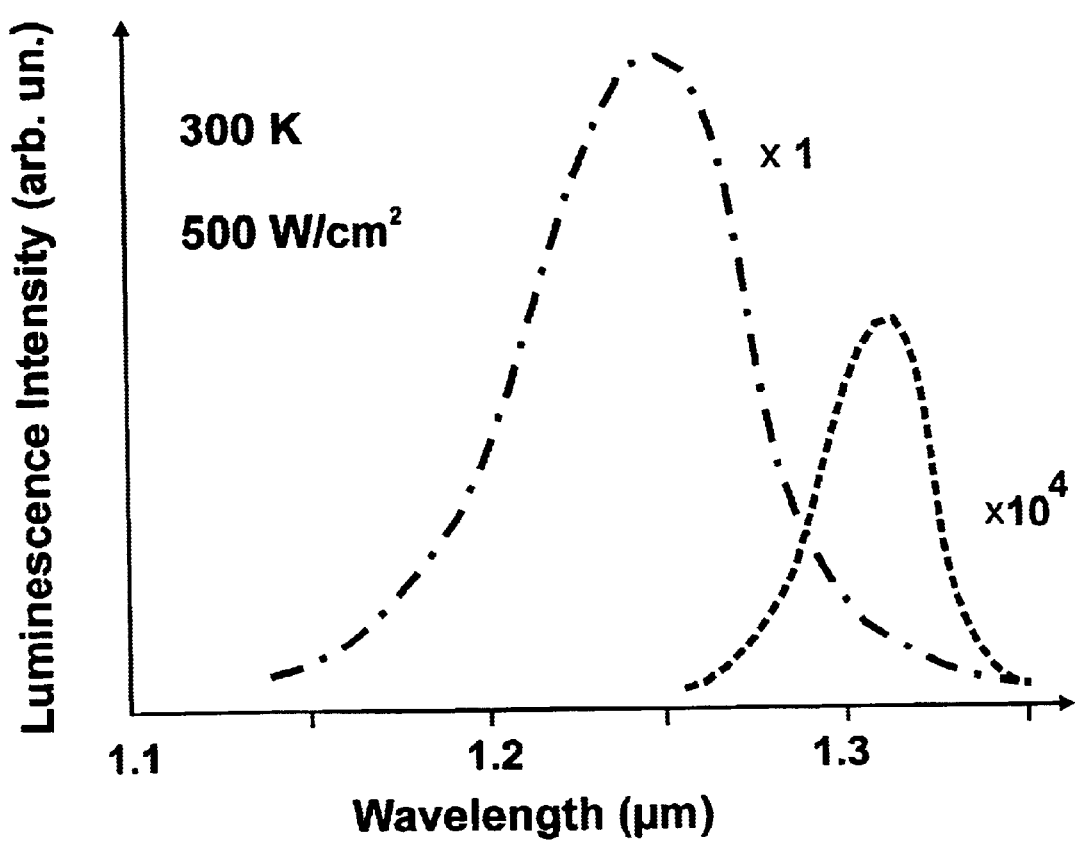
FIG. 5 shows a luminescence spectra of the devices grown with (dash-dotted) and without (dashed) the defect regions evaporation step.

In FIG. 5 room-temperature photoluminescence (PL) spectra of the structure with 6-nm thick $In_xGa_{1-x}As$ layer (3) with average indium composition of X=0.3–0.35 in a GaAs (1, 6) matrix grown by MBE at substrate temperature of 500° C. are shown. The PL spectrum of the structure grown without the defect reduction procedure is shown by a dashed line. The PL spectrum of the structure grown in the sequence proposed (100)–(160) using 2 nm AlAs cap layer and annealing temperature of 700° C. during 1 mm without arsenic flux, and covered by 30-nm thick GaAs layer is shown in FIG. 5 by a dash-dotted line. It is evident that the defect-reduction technique results in increase of the PL intensity by more than four orders of magnitude.

Figure 6:
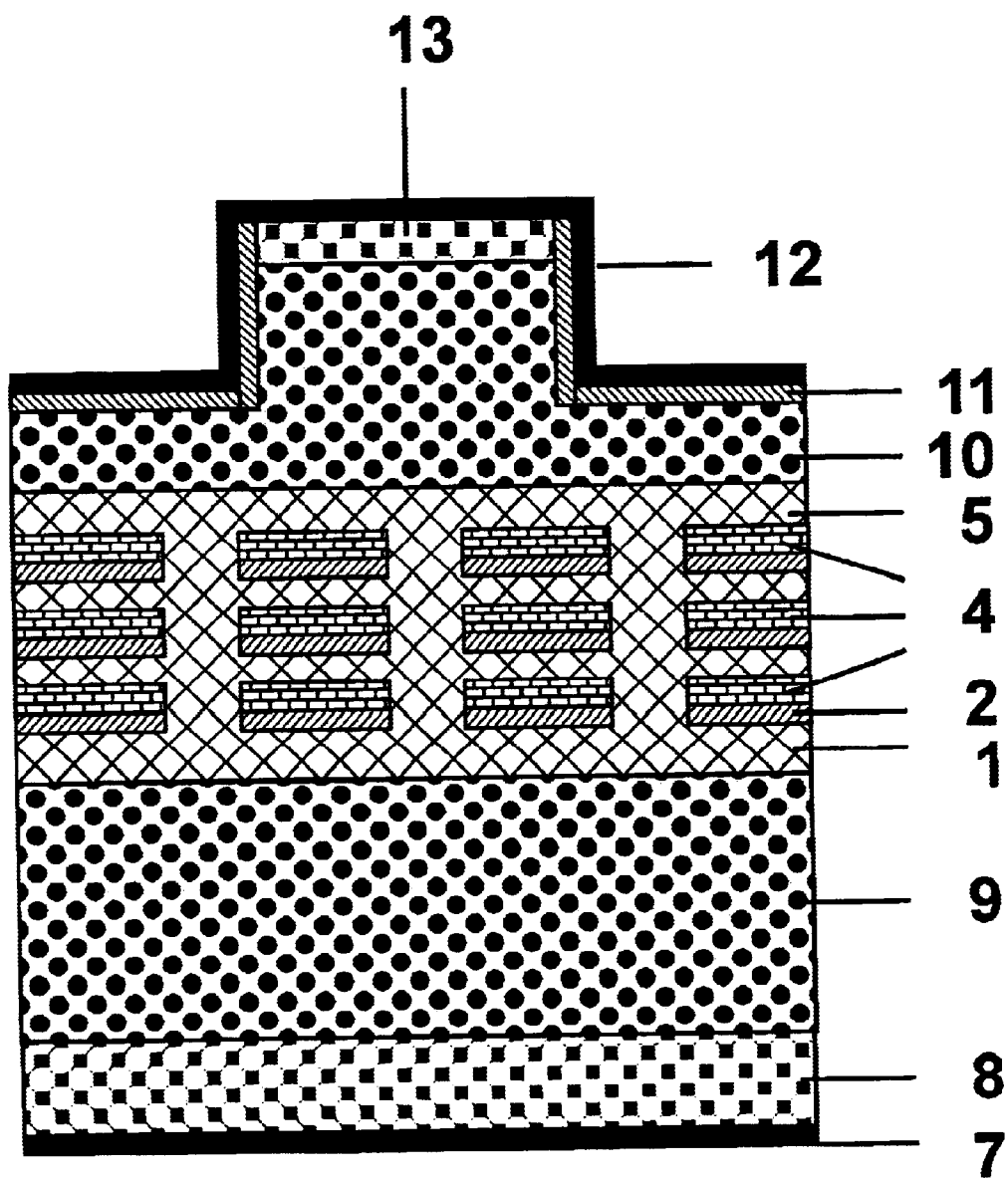
FIG. 6 shows a preferred design of an injection laser structure in an embodiment of the invention.

Further practical applications are also disclosed. For example, one particular application of the technique is to fabricate diode lasers. In diode lasers, dislocations and other defects such as defect dipoles and locally formed dislocated clusters are particularly disadvantageous. They act as a nonradiative recombination channel of the injected carriers, resulting in degradation of device performance and reduction of operation lifetime. A double heterostructure laser with separate electron and optical confinement is shown in FIG. 6. The injection laser structure includes a preferably 1–2 $\mu$m-thick Si-doped (preferably to $3-5 \cdot 10^{17}$ cm$^{-3}$) $Al_xGa_{1-x}As$ (x=0.3–0.8) cladding layer (9) grown on top of a Si-doped (preferably to $2-3 \cdot 10^{18}$ cm$^{-3}$) GaAs substrate (8) at 750° C. using molecular beam epitaxy. The n-GaAs layer (1), which is preferably 0.3 $\mu$m thick (preferably doped to less than $1-5 \cdot 10^{16}$ cm$^{-3}$), is grown on top of the $Al_{0.5}Ga_{0.5}As$ cladding layer (9) at 600° C. and provides the initial surface for the lattice-mismatched InGaAs layer (2) growth. An InGaAs dislocated layer (2) has an average indium composition preferably 30–35% and a thickness of preferably 5–10 nm, and deposited preferably at temperature 450–550° C., and covered with a 4 nm-thick AlAs layer (4). The thickness of the InGaAs dislocated layer (2) exceeds the critical thickness for pseudomorphic growth. The defect annealing procedure according to steps 110–160 is applied and repeated preferably three times (170) with additional GaAs layer (6) thickness of preferably 20–30 nm. After this the additional GaAs layer is grown on top with a thickness preferably 0.3 $\mu$m preferably having a free hole concentration below $5 \cdot 10^{16}$ cm$^{-3}$. A preferably 1–2 $\mu$m-thick p-doped (preferably to $3-5 \cdot 10^{17}$ cm$^{-3}$) $Al_xGa_{1-x}As$ (x=0.3–0.8) cladding layer (10) is grown on top and covered by a p-doped GaAs layer preferably to $3-5 \cdot 10^{18}$ cm$^{-3}$(13). A ridge-stripe structure is fabricated by optical lithography and $SiN_x$ isolation layers (11) and p-metal contact (12) layers (Ti-Pt-Au) are used. A Ni-Au-Ge metal contact layer (7) is deposited and annealed on the substrate side.

Figure 7:
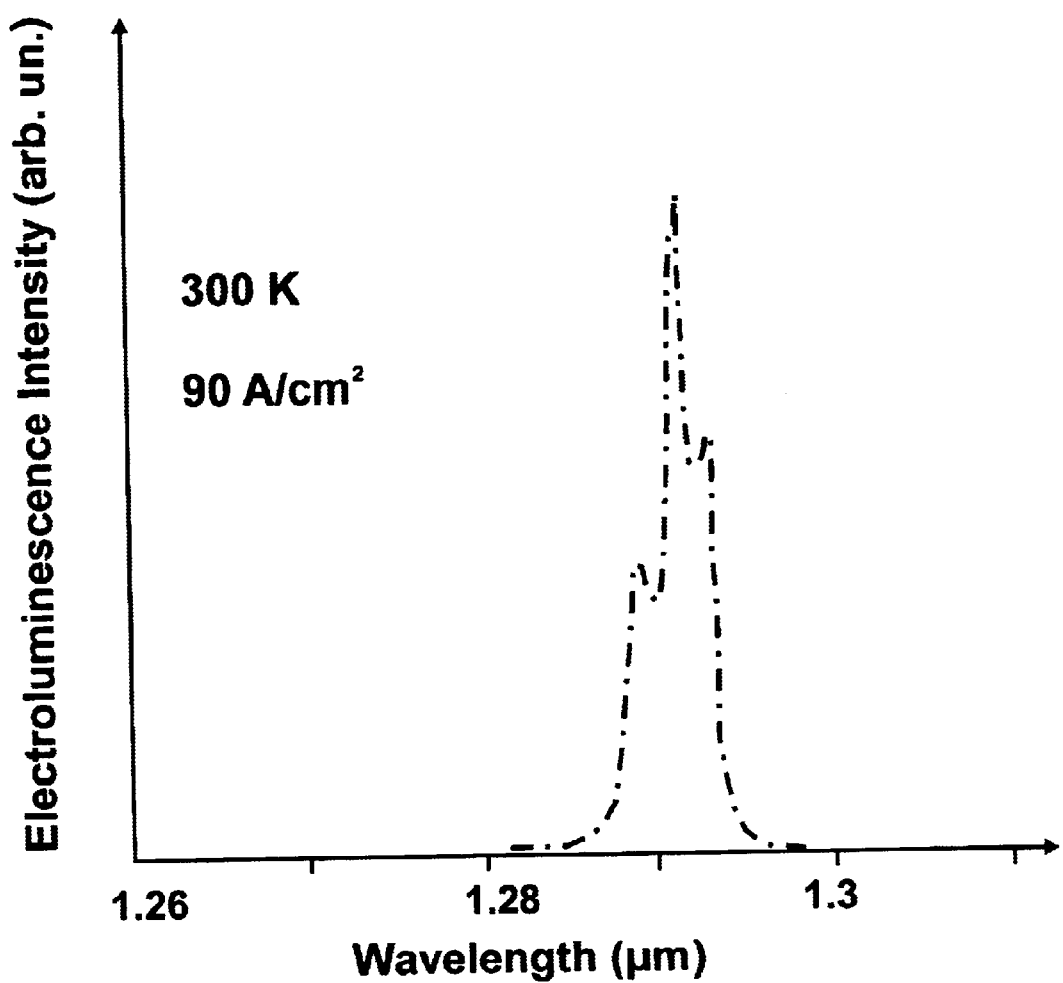
FIG. 7 shows electroluminescence spectrum of the device in a preferred embodiment of the invention.
Figure 4:
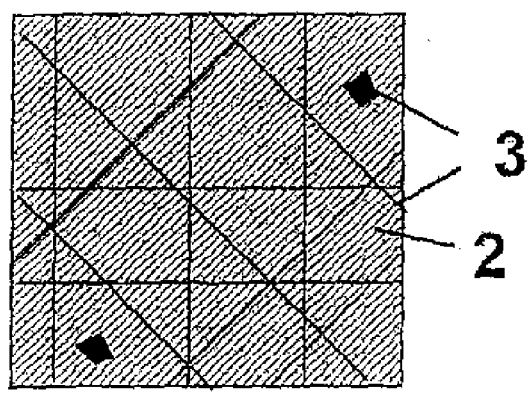
Figure 4:
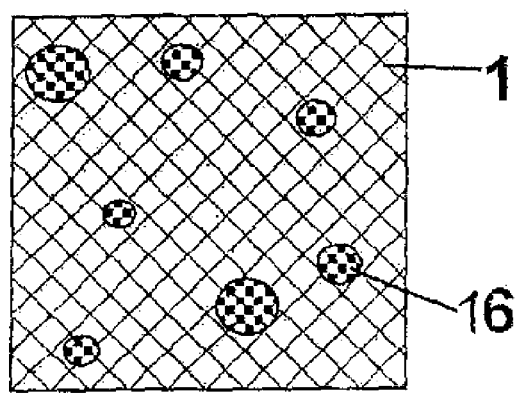
Figure 6:
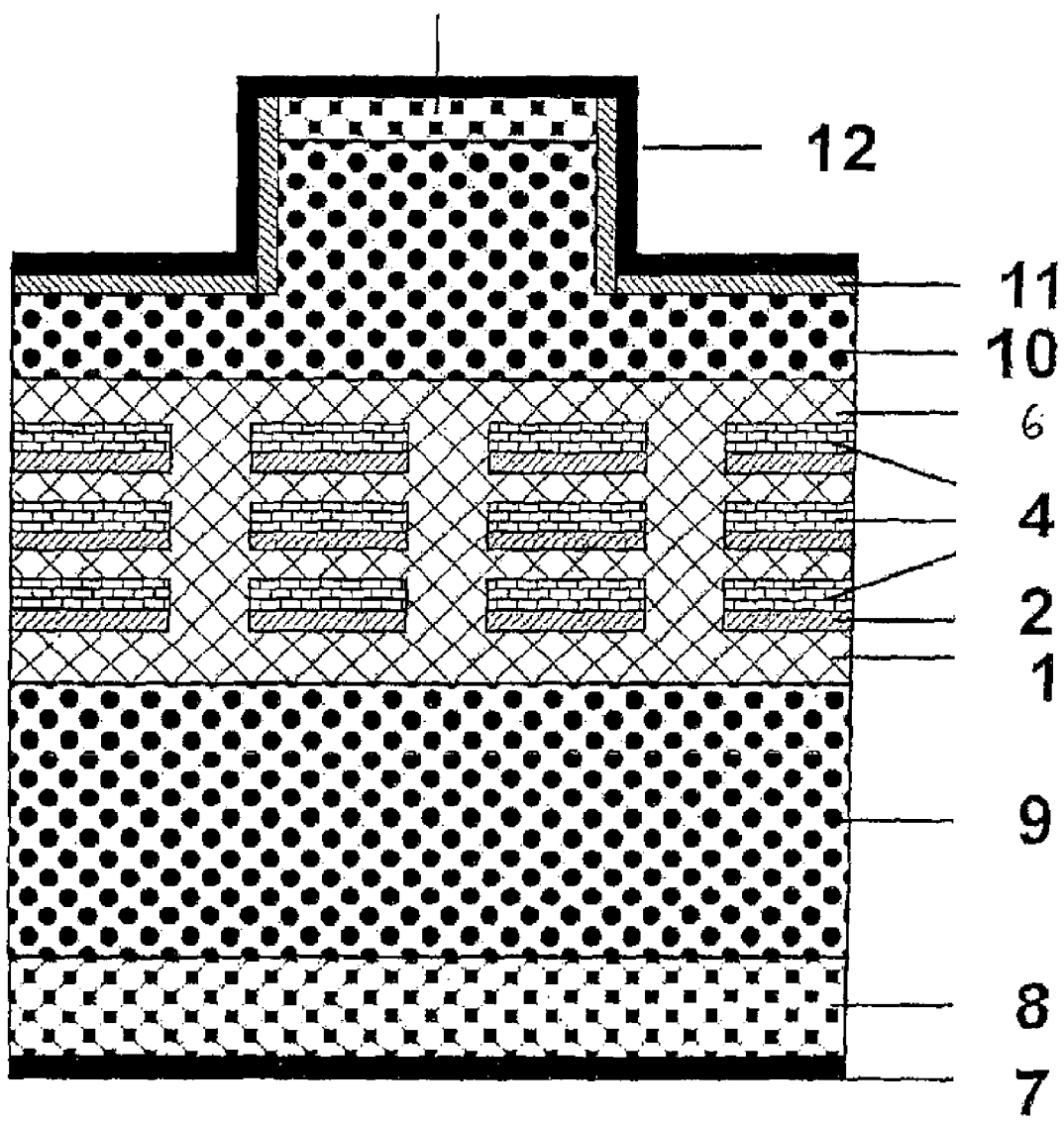

A lasing spectrum of the typical injection laser structure prepared according to this approach is shown in FIG. 7. The cavity length of the device was 2 mm. Uncoated facets were used. The lasing wavelength is typically at 1.26–1.29 $\mu$m.

Application of the technique to long-wavelength lasers on GaAs substrates emitting at 1.3 and 1.55 $\mu$m is also important. This application can not be realized by prior art strain-layer approaches due to a very high defect density resulting from plastic relaxation of the strain layer. However, using the above-described approach, defect-free injection lasers emitting at 1.3 $\mu$m on GaAs substrates are fabricated. The threshold current densities (300K) are approximately 70 A/cm$^2$ at 300 K in edge geometry and <1.5 kA/cm$^2$ in vertical cavity surface emitting laser geometry. Output powers at rom temperature are approximately 3 W and 0.8 mW CW, respectively.

In another embodiment, the pattern of dislocation networks, which is usually ordered due to the elastic interaction between dislocations, remains unaffected by the evaporation procedure. This situation arises when the substrate temperature and time are only sufficient to evaporate very narrow regions of the dislocated layer in the vicinity of dislocations. In this case, the coherently strained regions have the size and the shape defined by the initial dislocation network.

In yet another embodiment, high substrate temperature and long annealing times are used, when the cap layer is thick enough to keep the open surface area of the dislocated layer small. In this embodiment, the dislocations multiply during the annealing, resulting in formation of domains of small lateral size. These domains interact via the elastically-strained substrate. For the appropriate band-gap alignment of the first and the second semiconductor material and the substrate material, an ordered array of quantum-size nanostructures may be formed. This embodiment is preferable for layers with high lattice mismatch with the substrate and high annealing temperatures.

In another embodiment, the defect-free regions are used as templates for further epitaxial growth of semiconductor materials having an arbitrary lattice parameter, and the device is formed on top of the structure. For example, this embodiment is advantageous for producing dislocation-free (Al)GaN domains on sapphire or SiC substrates, used for subsequent overgrowth of dislocation-free (Al)GaN films.

Some examples of devices which could be fabricated using the method of the invention include diode lasers, light-emitting diodes, light amplifiers, tunneling diodes, photodetectors, far infrared intraband detectors, intraband far infrared emitters, solar cells, and optically bistable devices.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A method of manufacturing a semiconductor device deposited on a surface suitable for epitaxial growth having a first lattice constant and a first thermal evaporation rate comprising the steps of:
   a) depositing a lattice-mismatched layer, having a second lattice constant in no-strain state, which is different of the lattice constant of the surface, wherein the lattice-mismatched layer has a second thermal evaporation rate, wherein the lattice-mismatched layer is deposited until at least one dislocation in the lattice-mismatched layer is created and a desired thickness is reached;
   b) depositing a cap layer, having a third lattice constant and a third thermal evaporation rate wherein the third thermal evaporation rate is lower than the second evaporation rate, such that the cap layer nucleates selectively on at least one region of the lattice-mismatched layer such that the at least one dislocation is not covered by the cap layer; and
   c) annealing the device at a temperature and duration, such that the at least one dislocation is eliminated by local evaporation of the nearby region of the lattice-mismatched layer.

2. The method of claim 1, further comprising the step of, prior to step (a), depositing an epilayer on the surface.

3. The method of claim 2, further comprising the step of, after step (c), overgrowing an additional layer of the epilayer on the device.

4. The method of claim 1, wherein the at least one dislocation is selected from the group consisting of:
   a) at least one dislocation network;
   b) at least one local dislocation;
   c) at least one local defect dipole; and
   d) at least one dislocated three-dimensional cluster.

5. The method of claim 1, wherein the difference between the lattice constant of the cap layer in no-strain state and the surface is smaller or of opposite sign than the difference between the lattice constant of the lattice-mismatched layer and the surface.

6. The method of claim 1, wherein step (a) is performed using a growth technique selected from the group consisting of:
   a) molecular beam epitaxy deposition; and
   b) metal-organic chemical vapor deposition.

7. The method of claim 1, wherein steps (a) and (b) are repeated two times to twenty times.

8. The method of claim 1, wherein steps (b) and (c) are repeated two to forty times.

9. The method of claim 1, wherein steps (a) through (c) are repeated two to forty times.

10. The method of claim 1, wherein the semiconductor device is selected from the group consisting of:
   a) a diode laser;
   b) a light-emitting diode;
   c) a photodetector
   d) a light amplifier
   e) a far intraband infrared intraband detector;
   f) an intraband far infrared emitter;
   g) a heterojunction bipolar transistor;
   h) a resonant tunneling diode;
   k) a solar cell;
   l) an optically bistable device;
   m) a current-injection edge-emitting laser; and
   n) a vertical cavity surface emitting laser.

* * * * *

UNITED STATES PATENT AND TRADEMARK OFFICE
CERTIFICATE OF CORRECTION

PATENT NO.   : 6,653,166 B2
DATED        : November 25, 2003
INVENTOR(S)  : Nikolai Ledentsov It is certified that error appears in the above-identified patent and that said Letters Patent is hereby corrected as shown below:

<u>Drawings,</u>
Sheet 4 of 7, Fig. 4(b), replace reference numeral 6 with reference numeral 16 as attached.
Sheet 6 of 7, Fig. 6, replace reference numeral 5 with reference numeral 6 as attached.

Signed and Sealed this

Sixteenth Day of November, 2004

JON W. DUDAS
*Director of the United States Patent and Trademark Office*

(a)

(b)